United States Patent

[11] 3,558,974

[72] Inventor Richard D. Stewart
Camillus, N.Y.
[21] Appl. No. 725,307
[22] Filed Apr. 30, 1968
[45] Patented Jan. 26, 1971
[73] Assignee General Electric Company
a corporation of New York

[54] LIGHT-EMITTING DIODE ARRAY STRUCTURE
8 Claims, 5 Drawing Figs.

[52] U.S. Cl. 315/169, 317/234, 317/235; 307/311; 250/211, 250/213, 250/217
[51] Int. Cl. H05b 37/00
[50] Field of Search 315/169, 169TV; 317/234, 235, 4, 4.1, 5, 5.4, 22, 27; 307/311; 250/213A, 211J, 217SSL

[56] References Cited

UNITED STATES PATENTS

| | | | |
|---|---|---|---|
| 2,994,121 | 8/1961 | Shockley | 29/25.3 |
| 3,246,162 | 4/1966 | Chin | 250/211 |
| 3,443,166 | 5/1969 | Ing, Jr. et al. | 317/234 |
| 3,479,517 | 11/1969 | Bray et al. | 250/213 |

*Primary Examiner*—John W. Huckert
*Assistant Examiner*—R. F. Polissack
*Attorneys*—Marvin A. Goldenberg, Richard V. Lang, Frank L. Neuhauser, Oscar B. Waddell and Melvin M. Goldenberg

ABSTRACT: A light-emitting diode array structure in which a great number of diodes are integrally constructed and interconnected by contact electrodes on opposing faces of said diodes, said structure further presenting a readily accessible external connection to said diodes as well as accommodating light emission from said diodes. In one preferred embodiment the structure is composed of a matrix of p-si-n diodes.

INVENTOR:
RICHARD D. STEWART
BY Marvin [signature]
HIS ATTORNEY.

LIGHT-EMITTING DIODE ARRAY STRUCTURE

BACKGROUND OF THE INVENTION

1. Field of the Invention

The invention relates to the field of semiconductor device arrays and more particularly an integral fabrication of such arrays employing integrated circuit techniques.

2. Description of the Prior Art

Considerable work has been done in the field of array fabrication of semiconductor devices utilizing integrated circuit and monolithic techniques. By means of these techniques semiconductor chips, each of which may include one or more circuit devices, are mounted on a single substrate and the chips interconnected. In most instances the semiconductor chips, each of which may include one or more circuit devices, are mounted on a single substrate and the chips interconnected. In most instances the semiconductor chips have their contact electrodes arranged on a single surface so that electrical connections and interconnections can be made entirely to one side of the devices. Certain semiconductor devices, however, are fabricated with their contact electrodes on opposing surfaces and contact therefore must be made to either side of a device. Conventional fabrication techniques cannot be employed with respect to devices of this type in forming an array structure. An additional constraint is imposed where the devices are light-emitting and provision must be made for accommodating light transmission from said structures.

SUMMARY OF THE INVENTION

It is accordingly an object of the invention to provide a novel array structure of semiconductor devices having noncoplanar related contact electrodes wherein ready interconnections are made among said devices as well as providing a ready external connection to said devices.

It is a further object of the invention to provide a novel array structure as above described wherein said devices are light-emitting diodes and said structure must accommodate light transmission.

It is another object of the invention to provide a novel array structure of p–si–n diodes as above described which permits a ready alignment of a large multiplicity of said diodes upon a single substrate.

It is yet another object of the invention to provide a novel array structure as described wherein the semiconductor devices are arranged in matrix form.

It is a further object of the invention to provide a novel array structure as described wherein an integral diode matrix is constructed in which the number of diodes employed is not limited to the number that can be fabricated from a single crystal material.

In accordance with one aspect of the invention, these and other objects are accomplished by an array structure which includes a glass substrate having deposited thereon a first plurality of conductor strips, each strip having spaced contact electrodes along its length. A semiconductor chip, including a subarray of devices each having regions of opposite conductivity at opposing surfaces of the chip, is bonded to said substrate with discrete regions of one conductivity on a first surface of said chip making electrical contact with said spaced contact electrodes, thereby providing interconnection of first groups of said devices at said first surface. A top dielectric layer having a second plurality of conductor strips overlays the semiconductor chip and makes electrical contact with the other regions at the second surface of said chip so as to interconnect second groups of devices at said second surface.

In accordance with another aspect of the invention numerous semiconductor chips are bonded to the substrate wherein said first and second plurality of conductor strips provide interconnection among the devices of said numerous chips.

In accordance with a further aspect of the invention, said devices are light-emissive at their said other regions and said dielectric layer includes spaced apertures disposed along and within said second plurality of conductor strips for providing light transmission.

BRIEF DESCRIPTION OF THE DRAWING

The specification concludes with claims particularly pointing out and distinctly claiming the subject matter which is regarded as the invention. It is believed, however, that both as to its organization and method of operation, together with further objects and advantages thereof, the invention may be best understood from the description of the preferred embodiments, taken in connection with the accompanying drawings in which:

DESCRIPTION OF THE PREFERRED EMBODIMENTS

Figures 1, 2, 3, 4, 5:
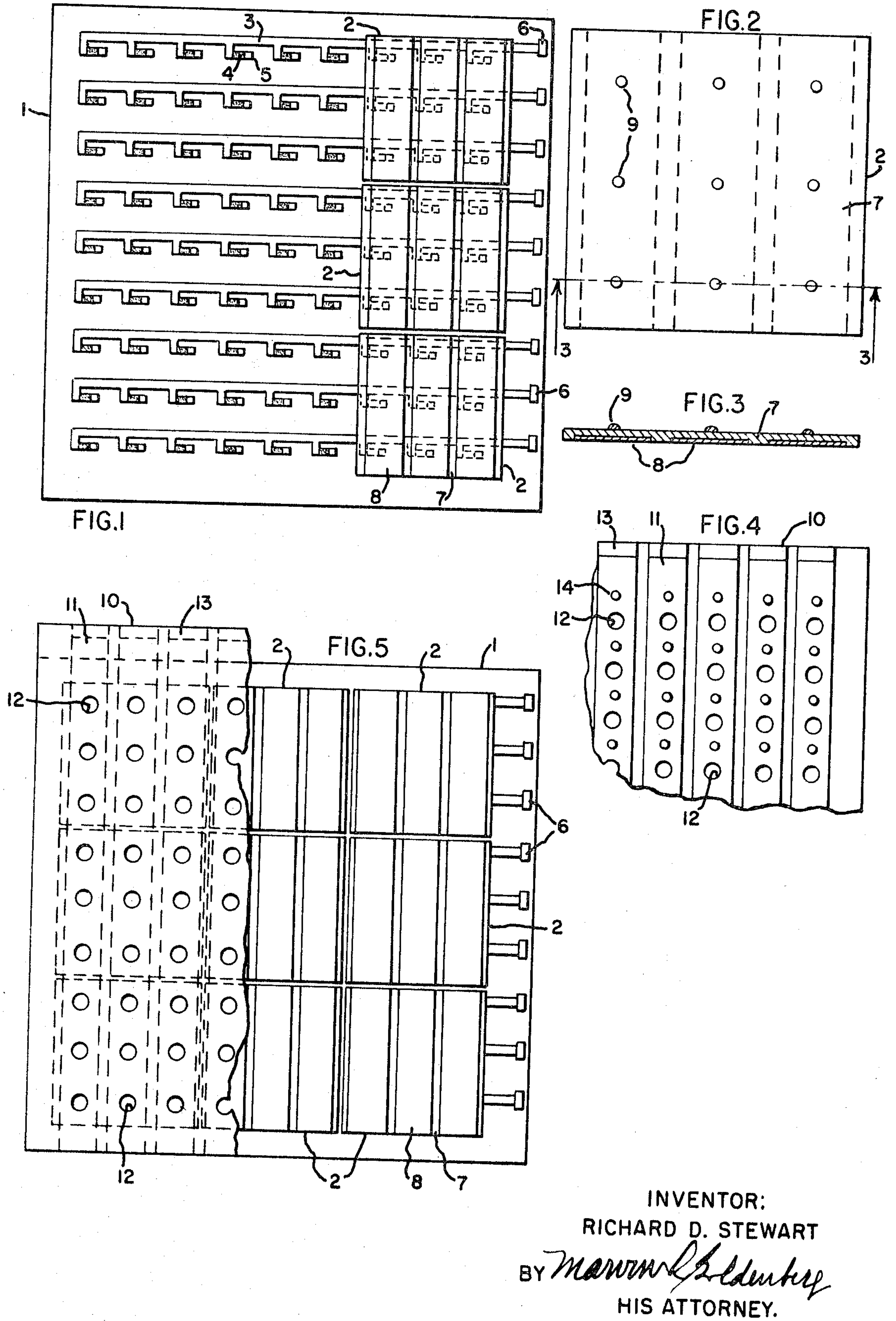
FIG. 1 is a plan view of a partially constructed diode array structure illustrating its dielectric substrate with a limited number of semiconductor chips bonded thereto.
FIG. 2 is a plan view of the opposing surface of a single semiconductor chip which contacts the conductor strips of the dielectric substrate.
FIG. 3 is a cross-sectional view of the semiconductor chip of FIG. 2 taken along the plane 3–3.
FIG. 4 is a plan view of the completed diode array structure including a top layer ceramic plate shown partially broken away.
FIG. 5 is a plan view of a portion of the ceramic plate shown from the undersurface.

With reference to FIG. 1 there is illustrated in plan view a partially constructed diode array structure, including a glass substrate 1 overlaid by three semiconductor chips 2. The completed structure provides a 3 × 3 matrix of semiconductor chips, with each chip 2 containing a 3 × 3 submatrix of individual devices. In the present embodiment, the individual devices are in the form of light-emitting p–si–n diodes. The invention, however, has application to other types of semiconductor devices having a noncoplanar electrode arrangement, and particularly with respect to devices which are light emitting. Only a limited number of devices such as p–si–n diodes can readily be fabricated upon a single crystal chip because of device and material nonuniformities, e.g., normally not more than several devices on a side. The number of semiconductor chips that can be mounted on the substrate 1, however, is essentially without limit, only a relatively few having been shown for ease of illustration.

The glass substrate 1 has deposited upon the upper surface thereof rows of thin film conductor strips 3, each row having a plurality of spaced resistor strips 4 terminated in metal contact electrodes 5. External contact terminals 6 are provided at one end of each conductor strip 3. The thin film conductor and resistor strips may be deposited upon the substrate 1 using conventional evaporation techniques. For example, they may be formed by, as a first step, evaporating a resistive material such as nichrome onto the surface of the glass 1 through a mask, the open portion of which conforms to the entire pattern to be formed, the nichrome being evaporated to a thickness of several hundred angstroms. A conductive material, such as gold, is then evaporated through a mask having an opening corresponding to the conductive portion of the pattern, to a thickness of a few thousand angstroms.

The semiconductor chips 2 have a plurality of p–si–n diode devices formed therein by means of fabrication techniques known to the art. Each chip includes a body of semi-insulating material 7, typically gallium arsenide, with *p* regions diffused into one surface thereof in the form of strips 8 common to several diode devices. Discretely alloyed into the opposing surface are *n* regions having raised metal contacts 9, as shown in the plan view of FIG. 2 and the cross-sectional view of FIG. 3 taken along the plane 3–3 in FIG. 2. A more detailed disclosure of p–si–n diode fabrication is contained in an application for U.S. Letters Patent entitled "Negative Resistance Light Emitting Solid State Devices," Ser. No. 451,122, now U.S. Pat. No. 3,443,166, filed Apr. 27, 1965 by S. W. Ing, Jr., et al., assigned to the assignee of the present invention.

The chips 2 are laid over the glass substrate 1 and the *n* alloyed contacts 9 are bonded to the contact electrodes 5. Prior to the bonding operation it is necessary to carefully register the alloyed contacts 9 with the contact electrodes 5. Bonding is performed by heating the structure to a temperature of about 290° C. while applying a pressure of a few p.s.i. The conductor strips 3 make common connection at the *n* regions along rows of the p–si–n diodes of the various chips 2.

A ceramic plate 10 overlays the semiconductor chips 2, shown partially broken away in the plan view of FIG. 4. The plate 10 is provided at its undersurface with conductor strips 11 which make common connection at the *p* regions 8 along columns of the p–si–n diodes of the various chips 2. The dielectric plate 10 further includes an array of apertures 12 through which is directed the light emitted from each of the diodes. External contact terminals 13 are provided at one end of each conductor strip 11. The conductor strips 11, which are typically of gold, are evaporated to a few thousand angstroms onto the ceramic plate surface so as to straddle the apertures 12. The undersurface of a portion of the ceramic plate 10 is shown in FIG. 5. Raised contact electrodes 14, shown in FIG. 5, are arranged along the length of the semiconductor strips 11 for providing electrical contact to the *p* regions 8. The contact electrodes 14 may be composed of indium pellets which are alloyed to the conductor strips 11 at a temperature of about 400° C. to a height of several mils. The ceramic plate is placed over the chips 2 with the conductors 11 aligned over the *p* region strips 8. The apertures 12 are positioned over the individual devices in approximate alignment with contacts 9 and the electrodes connected to the *p* regions 8 by a final bonding step at a temperature of 170° C. and a pressure of a few p.s.i.

The appended claims are intended to include within their meaning all modifications and changes to the described structure as may be said to reasonably fall within the true scope of the invention.

I claim:

1. A semiconductor device array structure, comprising:
a. a dielectric substrate having deposited thereon a first plurality of conductor strips;
b. a semiconductor chip including a subarray of light-emitting devices and having at opposing surfaces regions of different conductivity, said chip overlaying said dielectric substrate so that regions of one conductivity at a first surface of said chip make electrical contact with said conductor strips, thereby providing interconnection of first groups of said devices at said first surface; and
c. An apertured top dielectric layer having deposited thereon a second plurality of conductor strips, said top layer overlaying said chip so that said second plurality of conductor strips make electrical contact with regions of another conductivity at the second surface of said chip, thereby providing interconnection of second groups of devices at said second surface, said apertures being spaced along said second plurality of conductor strips in approximate alignment with said devices for light transmission.

2. A semiconductor device array structure as in claim 1 wherein said devices are p–si–n diodes.

3. A semiconductor device array structure as in claim 2 wherein said first plurality of conductors are arranged in rows and said second plurality of conductors are arranged in columns.

4. A semiconductor device array structure, comprising:
a. a dielectric substrate having deposited thereon a first plurality of conductor strips;
b. a plurality of semiconductor chips each including a subarray of light-emitting devices and having at opposing surfaces regions of different conductivity, said chips overlaying said dielectric substrate so that regions of one conductivity at a first surface of said chips make electrical contact with said conductor strips, thereby providing interconnection of first groups of devices contained by said chips at said first surface; and
c. An apertured top dielectric layer having deposited thereon a second plurality of conductor strips, said top layer overlaying said chips so that said second plurality of conductor strips make electrical contact with regions of another conductivity at the second surface of said chips, thereby providing interconnection of second groups of devices contained by said chips at said second surface, said apertures being spaced along said second plurality of conductor strips in approximate alignment with said devices for light transmission.

5. A semiconductor device array structure as in claim 4 wherein said devices are p–si–n diodes.

6. A semiconductor device array structure as in claim 5 wherein said chips are arranged in matrix form, said first plurality of conductors are arranged in rows and said second plurality of conductors are arranged in columns.

7. A semiconductor device array structure as in claim 6 wherein said regions of one conductivity are discretely arranged upon each chip and said regions of another conductivity are arranged upon each chip in strips common to columns of devices.

8. A semiconductor device array structure as in claim 7 in which there are provided spaced contact electrodes along the length of said first and second plurality of conductor strips for providing the electrical contact between said regions of different conductivity and said conductor strips.